United States Patent
MacDonald et al.

(10) Patent No.: US 6,573,761 B1
(45) Date of Patent: Jun. 3, 2003

(54) TIMEBASE FOR SAMPLING AN APPLIED SIGNAL HAVING A SYNCHRONOUS TRIGGER

(75) Inventors: Willard MacDonald, Bolinas, CA (US); Roger Lee Jungerman, Petaluma, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/117,954

(22) Filed: Apr. 8, 2002

(51) Int. Cl.$^7$ .............................. H03L 7/00; G11C 27/02
(52) U.S. Cl. ........................................ 327/91; 327/141
(58) Field of Search ........................... 327/91, 93, 141, 327/144, 145, 154, 155; 324/76.24; 713/400, 401, 500

(56) References Cited

U.S. PATENT DOCUMENTS

| | | | | |
|---|---|---|---|---|
| 3,843,926 A | * | 10/1974 | Espenlaub et al. | 324/76.24 |
| 5,454,015 A | * | 9/1995 | Olafsson | 375/345 |
| 6,401,213 B1 | * | 6/2002 | Jeddeloh | 713/401 |
| 6,434,706 B1 | * | 8/2002 | Jensen et al. | 713/500 |

OTHER PUBLICATIONS

Agilent Technologies, Inc. Attorney Docket No. 10010334–1—USSN 09/887,992 filed Jun. 22, 2001; Random Sampling With Phase Measurement; Inventors: Roger Lee Jungerman, Lovell H. Camnitz and Randall King.

Agilent Technologies, Inc. Attorney Docket No. 10011211–1—USSN 10/003,918 filed Nov. 1, 2001; Zero–Crossing Direction And Time Interval Jitter Measurement Apparatus Using Offset Sampling; Inventors: Lovell H. Camnitz, Roger Lee Jungerman and Randall King.

Agilent Technologies, Inc. Attorney Docket No. 10010400–1—USSN 09/919,155 filed Jul. 31, 2001; Quasi–Periodic Optical Sampling; Inventor: Roger Lee Jungerman.

Agilent Technologies, Inc. Attorney Docket No. 10011353–1—USSN 1/0,118,449 filed Apr. 8, 2002; Timebase For Sampling An Input Signal Having A Synchronous Trigger; Inventors: Willard MacDonald and Roger Lee Jungerman.

* cited by examiner

*Primary Examiner*—Toan Tran
(74) *Attorney, Agent, or Firm*—John L. Imperato

(57) ABSTRACT

A timebase establishes the timing of samples acquired by a signal sampler relative to a trigger signal that is synchronous with a signal applied to the signal sampler. A first pair of samplers included in the timebase acquires samples of a reference signal and of a shifted version of the reference signal provided within the timebase, according to a synchronous trigger, to establish a first time position on the reference signal. A second pair of samplers included in the timebase acquires samples of the reference signal and the shifted reference signal according to the synchronous trigger as delayed by a programmed time interval, to establish a second time position on the reference signal. While the programmed time interval is adjusted to designate timing of the sample acquisitions by the signal sampler, the two pairs of samplers in conjunction with a timing analyzer accurately determine the timing of these sample acquisitions based on the established time positions on the reference signal. Alternatively, a method determines the timing of the samples acquired from the signal sampler.

20 Claims, 4 Drawing Sheets

TIMEBASE FOR SAMPLING AN APPLIED SIGNAL HAVING A SYNCHRONOUS TRIGGER

BACKGROUND OF THE INVENTION

Oscilloscopes and other types of equivalent-time sampling systems are used to reconstruct the waveforms of many types of optical and electrical signals. Within an equivalent-time sampling system, samples of an applied signal are acquired by a sampler. A timebase within the equivalent-time sampling system establishes the timing of acquired samples, so that a waveform of the applied signal can be reconstructed on a display or other output device. Timing accuracy and jitter are performance parameters of the timebase that determine how accurately the waveform reconstructed by the sampling system represents the applied signal.

A first type of sampling system is shown in FIG. 1. The timebase for this sampling system includes a programmable delay that is relied upon to establish the timing of samples acquired by a sampler relative to an applied trigger signal. As a result, performance of the sampling system is limited by the performance attributes of the programmable delay. Due to inherent noise and inaccuracies of presently available devices and elements used to implement the programmable delay, timing accuracy of the sampling system is limited to approximately four picoseconds, and jitter is limited to greater than approximately one picosecond. This low timing accuracy and high jitter prevent this type of sampling system from accurately reconstructing the waveforms of many types of applied signals, such as those present in high data-rate communication systems.

A second type of sampling system is shown in FIG. 2. The timebase for this sampling system uses quadrature sampling of a clock signal to establish the timing of acquired samples of an applied input signal, and relies on the clock signal being synchronous with, or having an established periodic relationship with, the input signal. The quadrature sampling provides high timing accuracy (approximately 200 femtoseconds) and low jitter (approximately 100 femtoseconds). However, the acquired samples are timed according to a reference signal, which prevents the timing of acquired samples from being arbitrarily designated, thereby reducing the flexibility of this sampling system for reconstructing selected portions of the applied input signal. In addition, the sampling system is not suitable for reconstructing those portions of the applied input signal that do not lie within a single cycle, or period, of the clock signal.

In view of the shortcomings of the sampling systems shown in FIGS. 1–2, there is a need for a timebase that provides a sampling system with high timing accuracy and low jitter, and that also enables the timing of sample acquisitions to be arbitrarily designated.

SUMMARY OF THE INVENTION

A timebase constructed according to a first embodiment of the present invention establishes the timing of samples acquired by a signal sampler relative to a trigger signal that is synchronous with a signal applied to the signal sampler. The timebase has high timing accuracy, low jitter, and enables the timing of sample acquisitions of an applied signal to be arbitrarily designated.

A first pair of samplers included in the timebase acquires samples of a reference signal and of a shifted version of the reference signal provided within the timebase, according to a synchronous trigger, to establish a first time position on the reference signal. A second pair of samplers included in the timebase acquires samples of the reference signal and the shifted reference signal according to the synchronous trigger as delayed by a programmed time interval, to establish a second time position on the reference signal. While the programmed time interval is adjusted to designate timing of the sample acquisitions by the signal sampler, the two pairs of samplers in conjunction with a timing analyzer accurately determine the timing of these sample acquisitions based on the established time positions on the reference signal. As a result, timing accuracy and jitter of the timebase are independent of noise and inaccuracies of delay elements or devices used to set the programmed time interval. In an alternative embodiment of the present invention, the timebase is implemented according to a method that determines the timing of the samples acquired from the signal sampler.

DETAILED DESCRIPTION OF THE EMBODIMENTS

Figure 1:
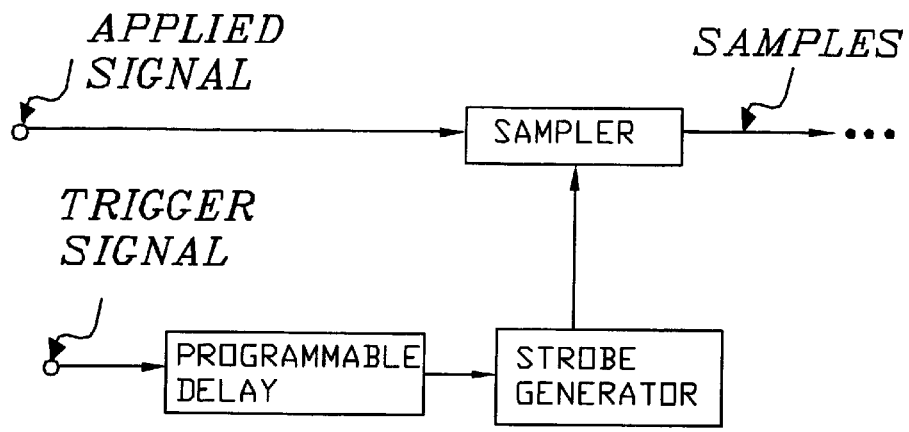
FIG. 1 shows the first type of sampling system.
Figure 2:
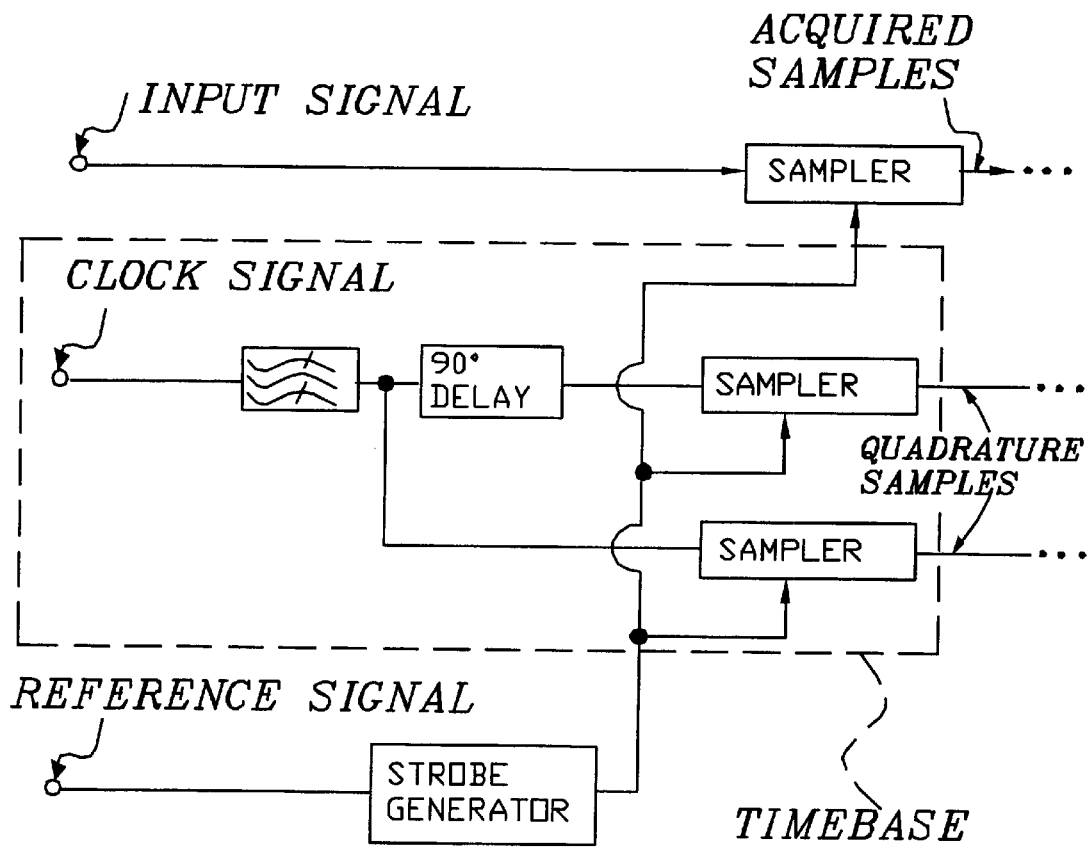
FIG. 2 shows the second type of sampling system.
Figure 3:
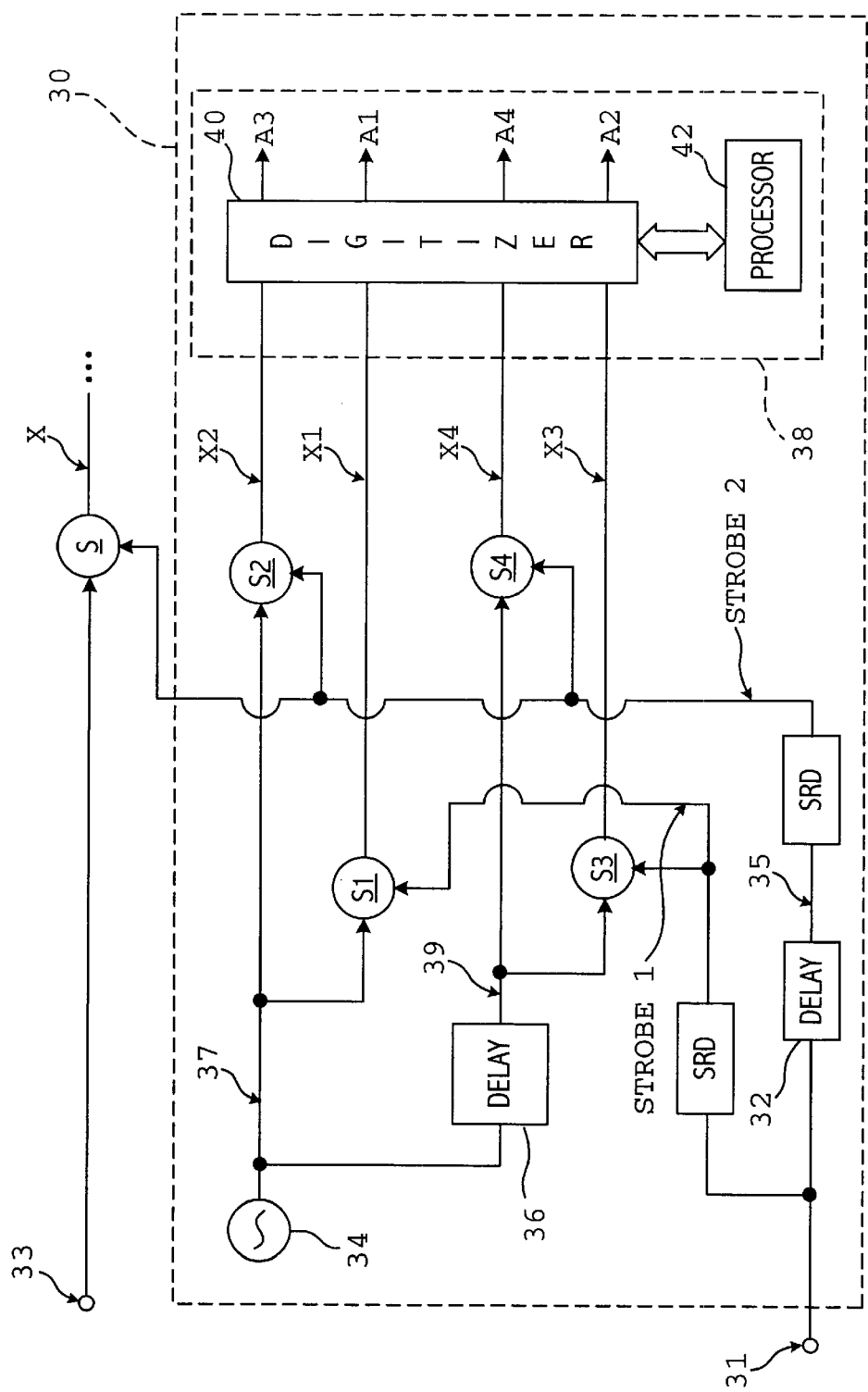
FIG. 3 shows a timebase constructed according to a first embodiment of the present invention.

FIG. 3 shows a timebase 30 constructed according to the first embodiment of the present invention. Typically, the timebase 30 is incorporated into an oscilloscope or other type of equivalent time sampling system that is used to analyze or reconstruct waveforms of applied optical or electrical signals on a display or other output device (not shown), based on samples X acquired by a signal sampler S. The timebase 30 establishes timing of the samples X acquired by the signal sampler S, relative to a trigger signal (hereinafter synchronous trigger 31) that is synchronous with a signal (hereinafter applied signal 33) applied to the signal sampler S. The synchronous trigger 31 is received by a programmable delay element 32 (hereinafter trigger delay 32) that shifts, or time-delays the synchronous trigger 31 by a programmed time interval $\tau_P$ to provide a delayed synchronous trigger 35.

The timebase 30 includes a reference source 34 that provides a reference signal 37 having a period T. The reference source 34 is typically an oscillator, signal generator, or other frequency-stable signal source. In the timebase 30, there is no requirement that the reference signal 37 provided by the reference source 34 be synchronous with, or have an established periodic relationship with, the applied signal 33. Thus, the reference signal 37 is independent of the applied signal 33.

The reference source 34 is coupled to a delay element (hereinafter reference delay 36) that shifts, or time-delays the reference signal 37 by a time interval $\tau_T$. The reference signal 37, as shifted by the time interval $\tau_T$ is designated as shifted reference signal 39. Jitter, timing instabilities, or other noise imposed on the shifted reference signal 39 by the reference delay 36 is minimized by implementing the reference delay 36 passively, for example, using a hybrid quadrature coupler, or a transmission line, or by implementing the reference delay 36 using any other low-noise element or device capable of shifting, or time-delaying, the reference signal 37 by the predesignated time interval $\tau_T$. While FIG. 3 shows the shifted reference signal 39 being generated by applying the reference signal 35 to the reference delay 36, any technique capable of generating a pair of coherent signals, wherein one signal of the pair is delayed or shifted relative to the other signal of the pair, is alternatively used to provide the reference signal 37 and the shifted reference signal 39.

Figure 4:
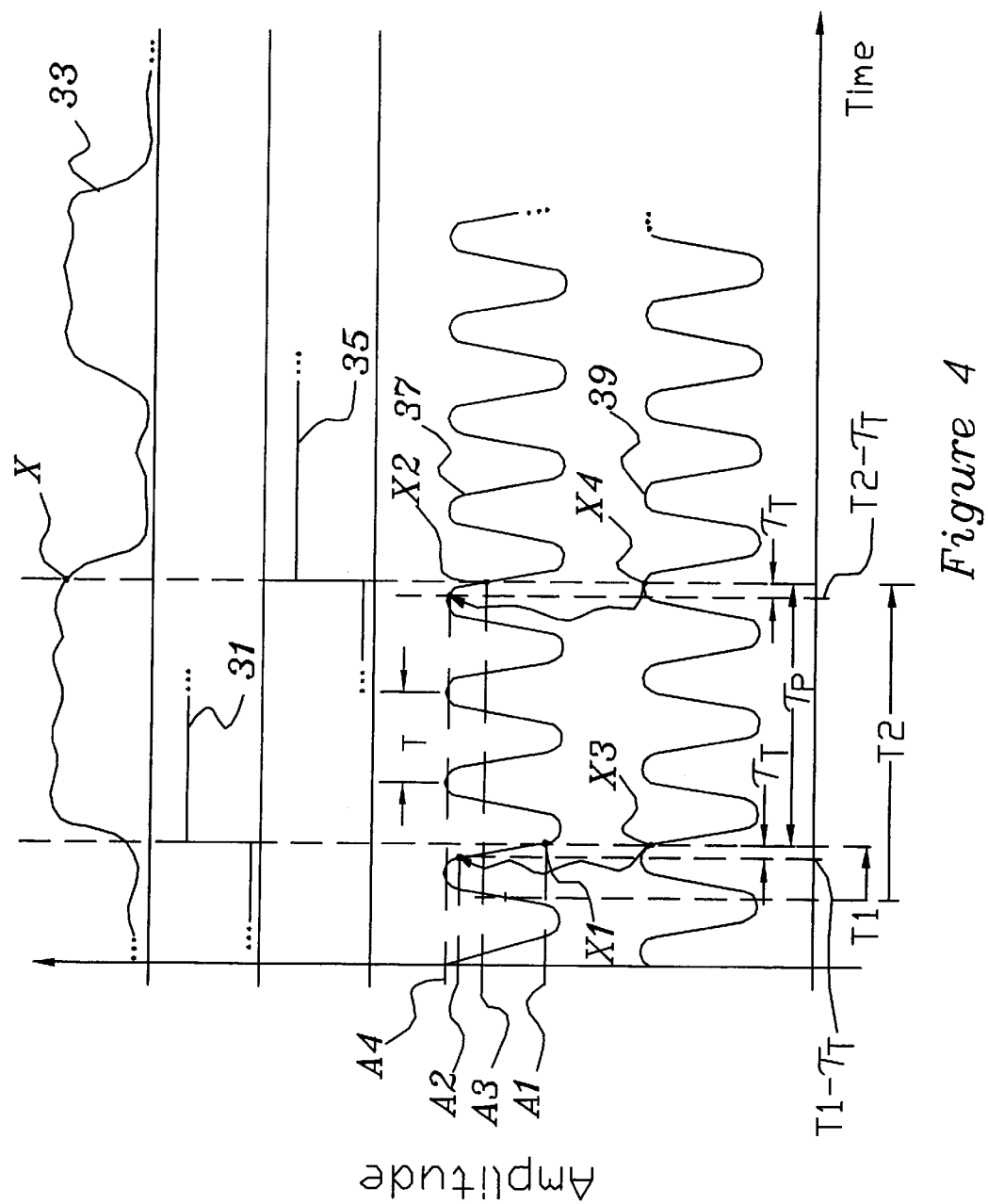
FIG. 4 is a timing diagram for the timebase shown in FIG. 3.

The reference signal 37, shown in a timing diagram in FIG. 4, has amplitude values at corresponding time positions. The reference signal 37 has the characteristic that a unique time position within each period T of the reference signal 37 is capable of being resolved based on two amplitude values of the reference signal 37 that are separated from each other in time by the time interval $\tau_T$. In the example shown in FIG. 4, the reference signal 37 is sinusoidal and the time interval $\tau_T$ is one-fourth the period T, or 90 degrees of phase, of the reference signal 37.

The timebase 30 includes a first sampler S1 and a second sampler S2 that each receive the reference signal 37. The timebase 30 also includes a third sampler S3 and a fourth sampler S4 that each receive the shifted reference signal 39. The samplers S1–S4 are typically diode-based switches, mixers, modulators, gating circuits, or other devices, suitable for acquiring samples of signals that are applied to the samplers in response to strobes.

A first strobe STROBE 1, activated by the synchronous trigger 31, is applied to the first sampler S1 and the third sampler S3. Typically, the first strobe STROBE 1 is generated via a step recovery diode (SRD) or other device or element that produces a pulse edge that is sufficiently sharp to provide a fast enough amplitude transition to drive the first sampler S1 and the third sampler S3 in response to the activation by the synchronous trigger 31. The first strobe STROBE 1 causes the first sampler S1 to acquire samples X1 of the reference signal 37 and causes the third sampler S3 to acquire samples X3 of the shifted reference signal 39, according to the synchronous trigger 31, as shown in the timing diagram of FIG. 4.

The samples X1 of the reference signal 37 acquired by the first sampler S1 and the samples X3 of the shifted reference signal 39 acquired by the third sampler S3 are presented to a timing analyzer 38. The timing analyzer 38, typically including a digitizer 40 and a processor 42, establishes a first amplitude value A1 of the reference signal 37 from the samples X1 and a second amplitude value A2 of the shifted reference signal 39 from the samples X3. Typically, the digitizer 40 includes at least one analog-to-digital converter (not shown) to transform the samples X1, X3 into corresponding amplitude values A1, A2. An intermediate frequency, or IF, converter (not shown) optionally included in the digitizer 40 enables low noise, low speed analog-to-digital converters to be used to transform the acquired samples into amplitude values. However, many types of digitizers are known in the art and are suitable for use as the digitizer 40 in the timebase 30.

The first amplitude value A1 and the second amplitude value A2 correspond to two amplitude values on the reference signal 37 at time positions T1 and T1-$\tau_T$, which are offset from each other by the time interval $\tau_T$ as shown in FIG. 4. The processor 42 maps the first amplitude value A1 and the second amplitude value A2 to the corresponding first time position T1 on the reference signal 37 using interpolation, look-up tables, mathematical relationships or other suitable techniques for extracting a unique time position within the period T of the reference signal 37 based on the first amplitude value A1 and the second amplitude value A2. For example, when the reference signal 37 is defined according to a mathematical function, the first time position T1 is optionally extracted from two amplitude values from an inverse of the mathematical function, or a variant of the inverse of the mathematical function. Alternatively, the amplitude values A1, A2 are both mapped to a unique time in a look-up table, so that from the amplitude values the first time position T1 can be extracted. In one example, where the reference signal 37 is sinusoidal and the time interval $\tau_T$ is one-fourth of the period T of the reference signal 37, the processor 42 maps the amplitude values A1, A2 to the first time position T1 according to the relationship T1=(T/360)* a1, where a1=arctan (A2/A1)+90 when A1$\geq$0 and where a1=arctan (A2/A1)+270 when A1<0.

A second strobe STROBE 2, activated by the shifted synchronous trigger 35 is applied to the second sampler S2 and the fourth sampler S4. Typically, the second strobe STROBE 2 is generated via a step recovery diode (SRD) or other device or element that produces a pulse edge that is sufficiently sharp to provide a fast enough amplitude transition to drive the second sampler S2 and the fourth sampler S4 in response to the activation by the shifted synchronous trigger 35. The second strobe STROBE 2 causes the second sampler S2 to acquire sample X2 of the reference signal 37 and causes the fourth sampler S4 to acquire sample X4 of the shifted reference signal 39, according to the shifted synchronous trigger 35 as shown in the timing diagram of FIG. 4.

The sample X2 of the reference signal 37 acquired by the second sampler S2 and the sample X4 of the shifted reference signal 39 acquired by the fourth sampler S4 are also presented to the timing analyzer 38 that establishes a third amplitude value A3 of the reference signal 37 from the sample X2 and a fourth amplitude value A4 of the shifted reference signal 39 from the sample X4. The third amplitude value A3 and the fourth amplitude value A4 correspond to two amplitude values on the reference signal 37 at time positions T2, T2-$\tau_T$, which are offset from each other by the predesignated time interval $\tau_T$. Each of the samples X1–X4 is a single sample, or a series of samples that are acquired and averaged, weighted, or otherwise processed to extract the samples X1–X4.

The processor 42 maps the third amplitude value A3 and the fourth amplitude value A4 to a corresponding second time position T2 on the reference signal 37 using interpolation, look-up tables, mathematical relationships, or other suitable techniques for extracting a unique time position within the period T of the reference signal 37 from the third amplitude value A3 and the fourth amplitude value A4. In the example where the reference signal 37 is sinusoidal and the time interval $\tau_T$ is one-fourth the period T of the reference signal 37, the processor 42 maps the amplitude values A3, A4 to the second time position T2 according to the relationship T2=(T/360)* a2+T*INT (($\tau_P$+T1)/T), where INT (($\tau_P$+T1/T) represents the greatest integer number of periods T of the reference signal 37 that are encompassed within the programmed time interval $\tau_P$ imposed by the trigger delay 32 and the time position T1, and where a2=arctan (A4/A3)+90 when A3$\geq$0, and where a2=arctan (A4/A3)+270 when A3<0.

Adjustment of the programmed time interval $\tau_P$ via the trigger delay 32 enables the timing of acquisitions of samples X by the signal sampler S to be arbitrarily designated. Typically, the programmed time interval $\tau_P$ is successively adjusted and the samplers S1–S4, in conjunction with the timing analyzer 38, accurately determine the timing of the acquisitions of the samples X based on the time difference between the time position T1 and the time position T2 on the reference signal 37 at each of the successive adjustments of the programmed time interval $\tau_P$. Because the timing of the samples X of the signal sampler S are determined relative to the synchronous trigger 31 based on the samples X1–X4 acquired by the samplers S1–S4, the timing accuracy and jitter of the timebase 30 are independent of noise and inaccuracies of delay elements or devices within the trigger delay 32 used to set the programmed time interval $\tau_P$ of the shifted synchronous trigger 35. In one example, the trigger delay 32 includes a combination of a counter, which provides for coarse adjustment of the programmed time interval $\tau_P$, and a capacitive charging circuit and threshold detector that converts a voltage ramp to time positions, which provides for fine adjustment of the programmed time interval $\tau_P$. However, there are numerous types of active or passive delay elements or devices that are suitable for the trigger delay 32.

The trigger delay 32 sets the programmed time interval $\tau_P$ accurately enough to establish the greatest integer number of periods of the reference signal 37 that are encompassed within the programmed time interval $\tau_P$. The greatest integer number of periods of the reference signal 37 encompassed within the programmed time interval $\tau_P$, is readily determined when the trigger delay 32 is accurate to within a single period T of the reference signal 37.

The reference signal 37 shown in FIG. 4 is sinusoidal, where the term sinusoidal includes pure sinusoidal waveforms, distorted sinusoidal waveforms and variations of sinusoidal waveforms. However, sawtooths, linear ramps, nonlinear ramps, or other types of periodic or semi-periodic reference signals 37 having amplitudes capable of being mapped to unique time positions within the period T of the reference signal 37 based on acquired samples X1–X4, are alternatively used. The time interval $\tau_T$ is designated so that the amplitude values A1, A2 are sufficiently separated in time to determine the first time position T1 on the reference signal 37 with sufficient timing accuracy and so that the amplitude values A3, A4 are sufficiently separated in time to determine the second time position T2 with sufficient timing accuracy. In the example where the reference signal 37 is sinusoidal, the time interval $\tau_T$ is chosen to be one-fourth the predetermined period T of the reference signal 37 so that when samples of the reference signal 37 and the shifted reference signal 39 are simultaneously acquired, under condition that one of the samples is on a low amplitude-slope portion of the reference signal 37, such as a maximum peak or minimum peak, the other of the samples will be on a maximum slope portion of the reference signal 37. This provides that at least one of the amplitude values A1, A2 is accurately established and at least one of the amplitude values A3, A4 is accurately established, even in the presence of noise contributed by the samplers S1–S4, or noise contributed by the digitizer 40 when transforming the samples X1–X4 to corresponding amplitude values A1–A4.

The processor 42 of the timebase 30 includes a microprocessor, computer, digital signal processor, controller or other device, element or system, either internal or external to the timebase, that has access to the amplitude values A1–A4 and has capacity to manipulate the amplitude values, perform calculations, and establish correspondence between the amplitude values and contents of a look-up table, memory or other storage element or device in order to extract the time positions T1, T2 from the amplitude values A1–A4. As an example, a model 86100B DIGITAL COMMUNICATIONS ANALYZER, available from AGILENT TECHNOLOGIES, INC., Palo Alto, Calif., includes an internal processor that is suitable for the processor 42 of the timebase 30.

The timebase 30 is implemented using analog hardware, digital hardware, software, or combinations of hardware and software. For example, digitizing one or more of the applied signal 33, the reference signal 37 or the synchronous trigger 31 enables one or more of the trigger delay 32, the reference delay 36, the timing analyzer 38, and the samplers S1–S4 to be implemented using hardware or software. Accordingly, the timebase 30 is alternatively implemented as a method 50 for determining the timing of the samples X acquired from the applied signal 33 having the synchronous trigger 31.

Figure 5:
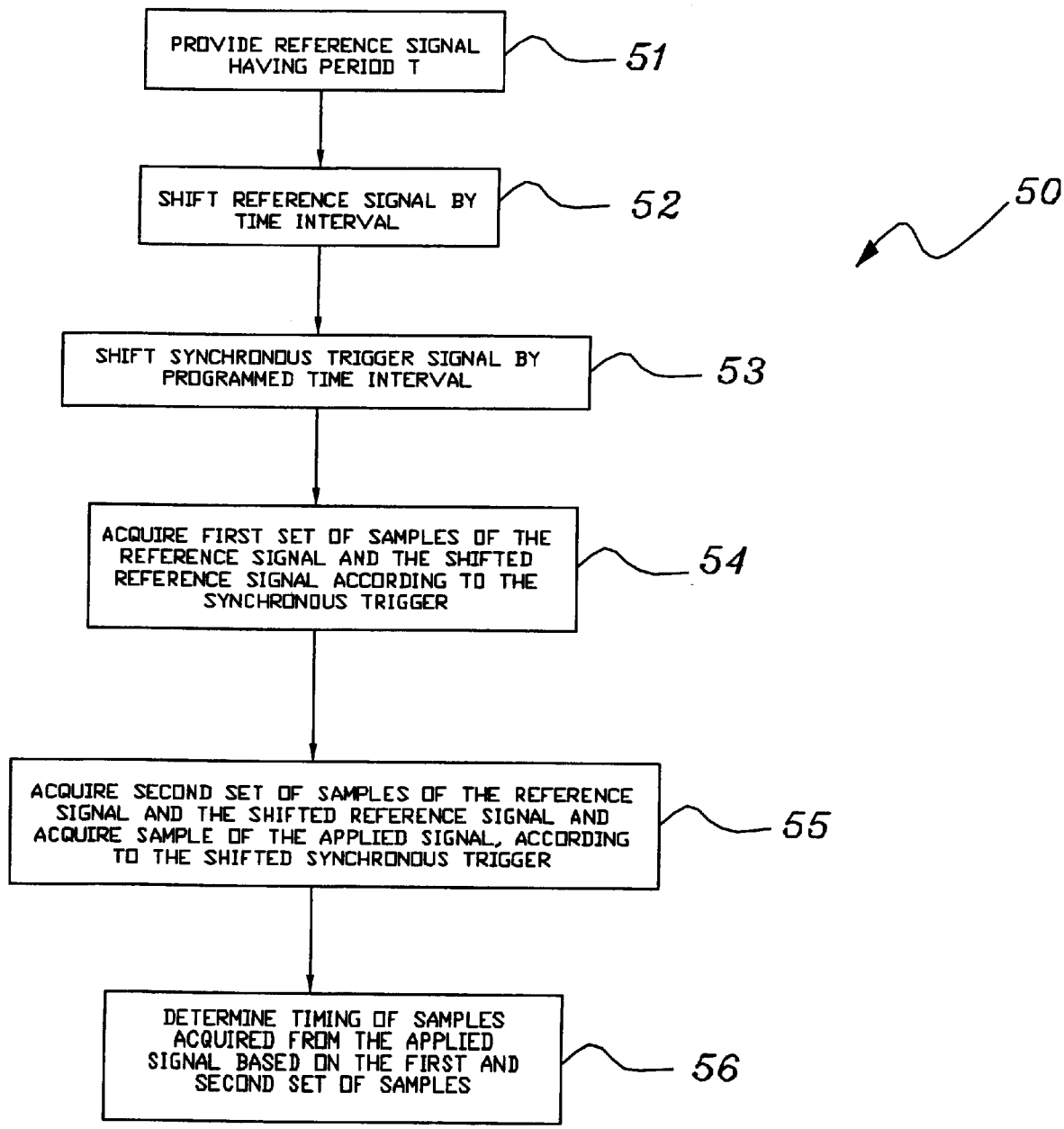
FIG. 5 is a flow diagram of a method for determining the timing of samples acquired from an applied signal having a synchronous trigger, constructed according to an alternative embodiment of the present invention.

FIG. 5 shows the method 50 constructed according to an alternative embodiment of the present invention. In step 51 of the method 50, the reference signal 37 having the predetermined period T is provided. In step 52, the reference signal 37 is shifted by a predesignated time interval. The synchronous trigger 31 is shifted by the programmed time interval $\tau_P$ in step 53. A first set of samples X1, X3 of the reference signal 37 and of the shifted reference signal 39, respectively, are acquired according to the synchronous trigger 31 in step 54. A second set of samples X2, X4 of the reference signal 37 and of the shifted reference signal 39, respectively, and sample X of the applied signal 33, are acquired according the shifted synchronous trigger 35 in step 55. In step 56, the timing of the samples X acquired from the applied signal 33 relative to the synchronous trigger 31 is determined based on the first set of samples X1, X3 of the reference signal 37 and of the shifted reference signal 39, and the second set of samples X2, X4 of the reference signal 37 and of the shifted reference signal 39. The first set of samples X1, X3 establishes the first time position T1 on the reference signal 37, the second set of samples X2, X4 establishes the second time position T2 on the reference signal 37, and the timing of the samples X acquired from the applied signal 33 is based on the time difference between the first time position T1 and the second time position T2 on the reference signal 37.

Typically, the first time position is established by converting the first set of samples X1, X3 to the first amplitude value A1 and the second amplitude value A2, and the second time position T2 is established by converting the second set of samples X2, X4 to a third amplitude value A3 and a fourth amplitude value A4. The first amplitude value A1 and the second amplitude value A2 are mapped to the first time position T1 on the reference signal 37 and the third amplitude value A3 and the fourth amplitude value A4 are mapped to the second time position T2 on the reference signal 37.

While the embodiments of the present invention have been illustrated in detail, it should be apparent that modifications and adaptations to these embodiments may occur to one skilled in the art without departing from the scope of the present invention as set forth in the following claims.

What is claimed is:

1. A timebase for a signal sampler receiving an applied signal having a synchronous trigger, comprising:

a reference source providing a reference signal having a predetermined period, coupled to a reference delay that shifts the reference signal by a predesignated time interval;

a first sampler and a second sampler, each receiving the reference signal;

a third sampler and a fourth sampler, each receiving the shifted reference signal;

a trigger delay receiving the synchronous trigger and shifting the synchronous trigger by a programmed time interval;

a first strobe activated by the synchronous trigger causing sample acquisitions of the reference signal by the first sampler and sample acquisitions of the shifted reference signal by the third sampler;

a second strobe activated by the shifted synchronous trigger causing sample acquisitions of the reference signal by the second sampler and sample acquisitions of the shifted reference signal by the fourth sampler, and causing sample acquisitions of the applied signal by the signal sampler; and a timing analyzer determining the timing of the sample acquisitions by the signal sampler relative to the synchronous trigger based on the sample acquisitions of the first sampler, the second sampler, the third sampler, and the fourth sampler.

2. The timebase of claim 1 wherein the reference signal has a series of amplitude values at a corresponding series of time positions.

3. The timebase of claim 2 wherein the sample acquisitions by the first sampler and by the third sampler establish a first time position on the reference signal, the sample acquisitions by the second sampler and by the fourth sampler establish a second time position on the reference signal, and wherein the timing of the sample acquisitions by the signal sampler is the time difference between the first time position and the second time position on the reference signal.

4. The timebase of claim 3 wherein the programmed time interval is successively adjusted and at each of the successive adjustments of the programmed time interval, the first strobe activated by the synchronous trigger causes sample acquisitions of the reference signal by the first sampler and sample acquisitions of the shifted reference signal by the third sampler, and the second strobe, activated by the shifted synchronous trigger, causes sample acquisitions of the reference signal by the second sampler and sample acquisitions of the shifted reference signal by the fourth sampler, and sample acquisitions of the applied signal by the signal sampler.

5. The timebase of claim 3 wherein the timing analyzer includes a digitizer converting the sample acquisitions by the first sampler into a first amplitude value of the reference signal, converting the sample acquisitions by the third sampler into a second amplitude value of the reference signal, converting the sample acquisitions by the second sampler into a third amplitude value of the reference signal, and converting the sample acquisitions by the fourth sampler into a fourth amplitude value of the reference signal.

6. The timebase of claim 5 wherein the first amplitude value and the second amplitude value are mapped to the first time position on the reference signal and the third amplitude value and the fourth amplitude value are mapped to the second time position on the reference signal.

7. The timebase of claim 6 wherein the first amplitude value and the second amplitude value are mapped to the first time position on the reference signal via a mathematical relationship and the third amplitude value and the fourth amplitude value are mapped to the second time position on the reference signal via a mathematical relationship.

8. The timebase of claim 6 wherein the first amplitude value and the second amplitude value are mapped to the first time position on the reference signal via a look-up table and the third amplitude value and the fourth amplitude value are mapped to the second time position on the reference signal via a look-up table.

9. The timebase of claim 1 wherein the reference signal is sinusoidal and the predesignated time interval is one-fourth of the predetermined period of the reference signal.

10. The timebase of claim 2 wherein the reference signal is sinusoidal and the predesignated time interval is one-fourth of the predetermined period of the reference signal.

11. The timebase of claim 3 wherein the reference signal is sinusoidal and the predesignated time interval is one-fourth of the predetermined period of the reference signal.

12. The timebase of claim 4 wherein the reference signal is sinusoidal and the predesignated time interval is one-fourth of the predetermined period of the reference signal.

13. The timebase of claim 5 wherein the reference signal is sinusoidal and the predesignated time interval is one-fourth of the predetermined period of the reference signal.

14. The timebase of claim 6 wherein the reference signal is sinusoidal and the predesignated time interval is one-fourth of the predetermined period of the reference signal.

15. A method for establishing timing of samples acquired from an applied signal having a synchronous trigger, comprising:

providing a reference signal having a predetermined period;

shifting the reference signal by a predesignated time interval;

shifting the synchronous trigger by a programmed time interval;

acquiring a first set of samples of the reference signal and of the shifted reference signal, according to the synchronous trigger;

acquiring a second set of samples of the reference signal and of the shifted reference signal, according the shifted synchronous trigger;

acquiring a sample of the applied signal according to the shifted synchronous trigger; and determining the timing of the sample acquired from the applied signal relative to the synchronous trigger based on the first set of samples of the reference signal and of the shifted reference signal, and the second set of samples of the reference signal and of the shifted reference signal.

16. The method of claim 15 wherein the reference signal has a series of amplitude values at a corresponding series of time positions and wherein each of the time positions within the series of time positions is mapped to two amplitude values within the series of amplitude values, that are separated by the predesignated time interval.

17. The method of claim 16 wherein the first set of samples of the reference signal and of the shifted reference signal establish a first time position on the reference signal, the second set of samples of the reference signal and of the shifted reference signal establish a second time position on the reference signal, and wherein the timing of the samples acquired from the applied signal is based on the time difference between the first time position and the second time position on the reference signal.

18. The method of claim 17 wherein establishing the first time position includes converting the first set of samples of the reference signal and of the shifted reference signal to a first amplitude value and a second amplitude value, and establishing the second time position includes converting the second set of samples of the reference signal and of the shifted reference signal to a third amplitude value and a fourth amplitude value.

19. The method of claim 18 wherein the first amplitude value and the second amplitude value are mapped to the first time position on the reference signal and the third amplitude value and the fourth amplitude value are mapped to the second time position on the reference signal.

20. The method of claim 15 wherein the reference signal is sinusoidal and the predesignated time interval is one-fourth of the predetermined period of the reference signal.

* * * * *